(12) United States Patent
Grodzki

(10) Patent No.: US 8,482,283 B2
(45) Date of Patent: Jul. 9, 2013

(54) METHOD AND MAGNETIC RESONANCE SYSTEM TO DETERMINE THE STRENGTH OF A MAGNETIC INTERFERENCE FIELD

(75) Inventor: David Grodzki, Hannover (DE)

(73) Assignee: Siemens Aktiengesellschaft, Munich (DE)

( * ) Notice: Subject to any disclaimer, the term of this patent is extended or adjusted under 35 U.S.C. 154(b) by 335 days.

(21) Appl. No.: 12/835,846

(22) Filed: Jul. 14, 2010

(65) Prior Publication Data

US 2011/0012595 A1 Jan. 20, 2011

(30) Foreign Application Priority Data

Jul. 17, 2009 (DE) .......................... 10 2009 033 606

(51) Int. Cl.
*G01R 33/48* (2006.01)
(52) U.S. Cl.
USPC .......................................... 324/309; 324/307
(58) Field of Classification Search
USPC ................................................ 324/309, 307
See application file for complete search history.

(56) References Cited

U.S. PATENT DOCUMENTS 5,073,858 A * 12/1991 Mills ............................. 600/410

OTHER PUBLICATIONS

R. S. Davis, New Method to Measure Magnetic Susceptibility, 1993, Meas. Sci. Technol., 4, pp. 141-147.*
Jezzard et al.; Correction for Geometric Distortion in Echo Planar Image From B0 Field Variations, Magnetic Resonance in Medicine, vol. 34, (1995) pp. 65-73.
John F. Schenck, The role of magnetic susceptibility in magnetic resonance imaging: MRI magnetic compatibility of the first and second kinds. Med. Phys. vol. 23. pp. 815-850 (1996).
Robson et al., Identifying Particles in Industrial Systems using MRI Susceptibility Artefacts. AlChE Journal, vol. 51, pp. 1633-1640, (2005).
Beuf et al., Magnetic Resonance Imaging for the Determination of Magnetic Susceptibility of Materials. Journ. of Magn. Reson., Series B 112, pp. 111-118 (1996).
Bos et al., On the Artifact of a Subvoxel Susceptibility Deviation in Spoiled Gradient-Echo Imaging. Magn. Reson. Med., vol. 50, pp. 400-404 (2003).
Bakker et al., 3D Analysis of Susceptibility Artifacts in Spin-Echo and Gradient-Echo Magnetic Resonance Imaging, Proc. Int. Soc. Magnetic Resonance in Medicine, 1993, p. 746 (1993).
Wang et al., Magnetic Resonance Imaging Measurement of Volume Magnetic Susceptibility Using a Boundary Condition. J. of Magnetic Resonance 140, pp. 477-481 (1999).

(Continued)

*Primary Examiner* — Melissa Koval
*Assistant Examiner* — Rishi Patel
(74) *Attorney, Agent, or Firm* — Schiff Hardin LLP

(57) ABSTRACT

In a method and magnetic resonance system to determine the strength of a magnetic interference field that is caused by an interference object in a magnetic resonance image data acquisition, the interference object having a magnetic susceptibility that differs from the magnetic susceptibility of the material that surrounds the interference object image data acquired with the imaging magnetic resonance measurement that depict an examination subject that contains the interference object are made available in a form that allows the determination of at least one geometric variable of an image artifact in the image data that was caused by the magnetic interference field. The strength of the magnetic interference field that is caused by the interference object is then determined on the basis of the determined geometric variable of the image artifact.

19 Claims, 3 Drawing Sheets

OTHER PUBLICATIONS

Shafiei et al.: Artifacts from Dental Casting Alloys in Magnetic Resonance Imaging. Research Reports, J. of Dental Research, vol. 82, pp. 602-606 (2003).

Bennett et al., Artifacts in Magnetic Resonance Imaging from Metals. J. of Applied Physics, vol. 79, pp. 4712-4714, (1996).

Stephane Balac, Artefacts de susceptibilité magnétique en IRM: étude du probléme de magnétostatique et simulation numérique, Thése, Université de Rennes, Chapter 8 (1997).

* cited by examiner

_FIG. 2_
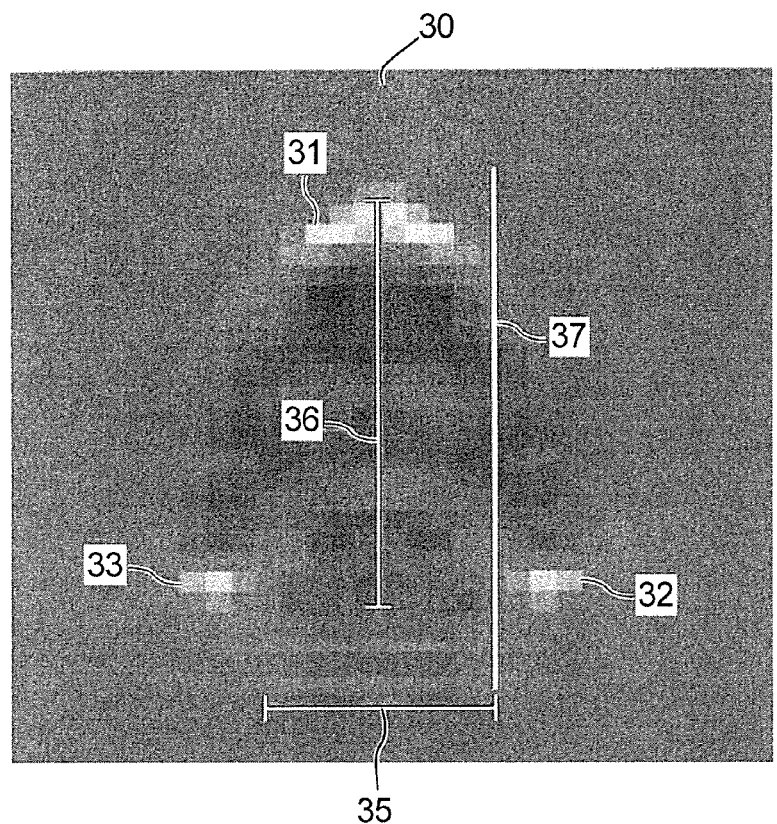
_FIG. 3_
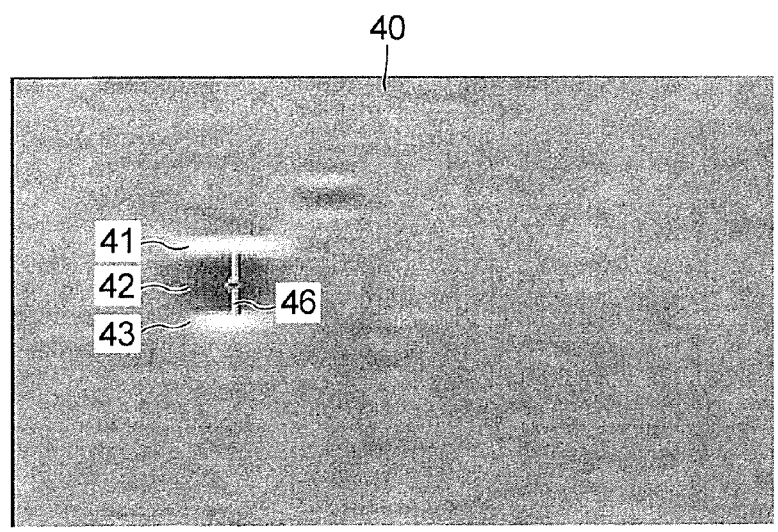

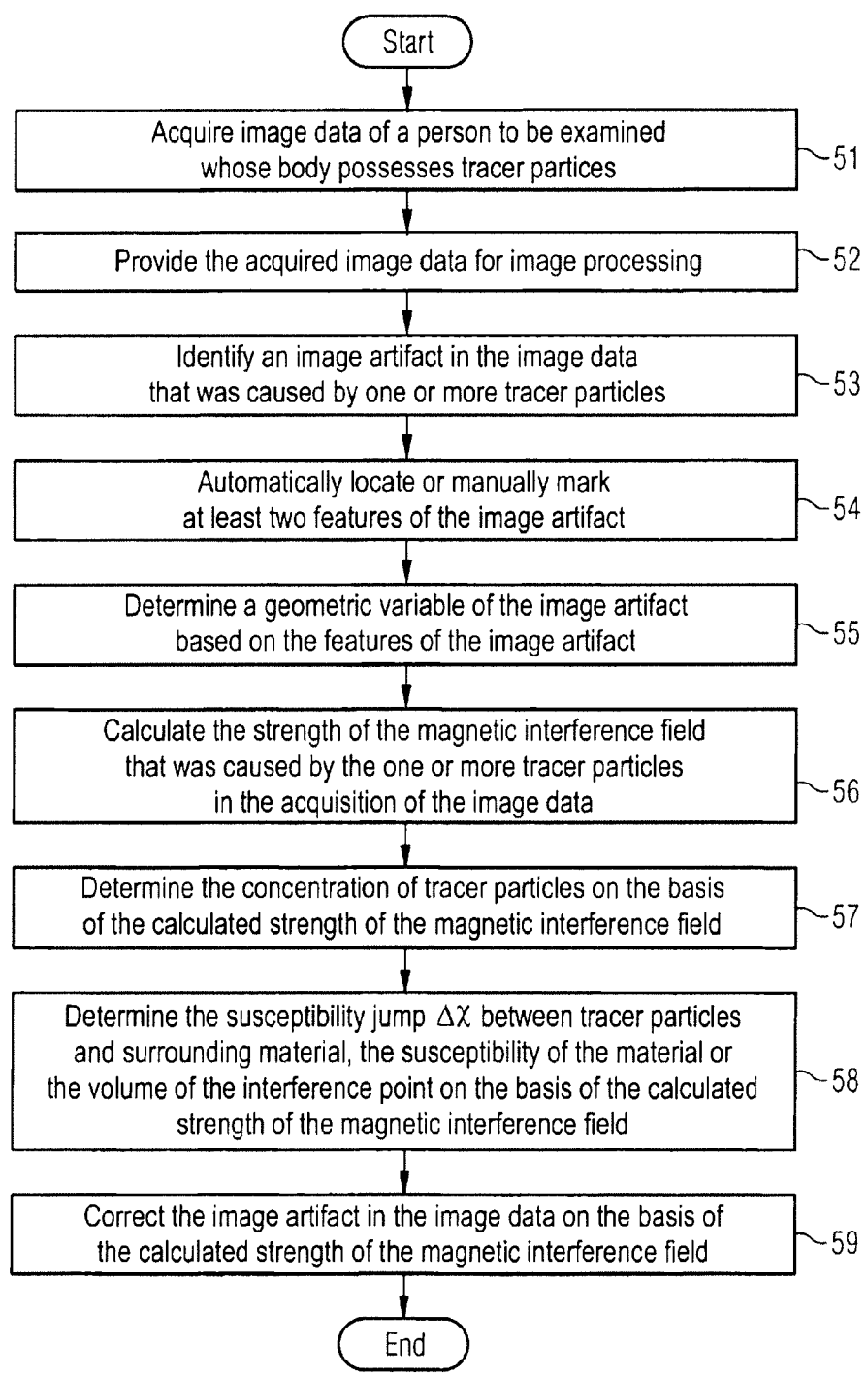

METHOD AND MAGNETIC RESONANCE SYSTEM TO DETERMINE THE STRENGTH OF A MAGNETIC INTERFERENCE FIELD

BACKGROUND OF THE INVENTION

1. Field of the Invention

The present invention concerns a method to determine the strength of a magnetic interference field that is caused by an interfering object in an imaging magnetic resonance measurement, and a magnetic resonance system for this purpose.

2. Description of the Prior Art

In imaging magnetic resonance tomography, a contrast agent is frequently used in order to make specific structures in the body of an examination subject visible. It is also possible to introduce tracer particles into the body of the person to be examined, the tracer particles having specific (for example magnetic) properties enabling the particles to be located in the body. Hollow spheres—that can furthermore exhibit a therapeutic effect on the body of the person to be examined—are known for use as tracer particles. For example, islet cells that subsequently produce insulin in the body of the person to be examined can be introduced into the hollow spheres.

The magnetic susceptibility of the tracer particles or the contrast agent often differ significantly from the susceptibility of the material that surrounds the tracer particles in the body of the person to be examined. In an imaging magnetic resonance measurement (data acquisition), the tracer particles thus represent interference points, and thus they can only be imaged with difficulty and lead to image artifacts in the acquired image data. Furthermore, accumulations of the tracer particles in the body of the person to be examined cannot be quantified. The body of the person to be examined may also exhibit additional interference points, for example dental implants or air bubbles that likewise lead to artifacts in the image data. Not only is it difficult to image these interference objects, but the artifacts can overlay surrounding regions, such that no evaluable image data are obtained from these overlaid regions.

There is thus a need not only to obtain an optimally artifact-free imaging of the region to be examined but also to be able to make quantitative statements about the interference object. In particular the determination of the concentration of an accumulation of interference objects and the quantification of the magnetic susceptibility of the interference object or of the material surrounding the interference object and the volume of the interference object are of interest. Such a quantification cannot be achieved with conventional methods.

SUMMARY OF THE INVENTION

An object of the present invention is to provide a method and a magnetic resonance system with which a quantification of an interference caused by such an interference object can be achieved.

According to a first aspect of the present invention, a method is provided to determine the strength of a magnetic interference field that is caused by an interference object in an imaging magnetic resonance measurement, that interference object having a magnetic susceptibility that differs from the magnetic susceptibility of the material that surrounds the interference object. The method includes making image data, acquired in an imaging magnetic resonance measurement, the image data depicting an examination subject that contains the interference object available in a form that allows the determination of at least one geometric variable of an image artifact in the image data that was caused by the magnetic interference field. The strength of the magnetic interference field that is caused by the interference object is then determined based on the determined geometric variable of the image artifact.

Through such analysis of the artifact it is thus possible to deduce the interference field caused by the interference object, such that a quantification of the interference object (for example the determination of a particle concentration) is enabled. The interference field can be determined by the analysis of an image artifact (that is merely considered a disruption of the image data in conventional magnetic resonance measurements) and the determination of a geometric quantity of this (for example a characteristic length). Conclusions about properties of the interference object and of the material surrounding the interference object can be made from the determination of the strength of the interference field.

In an embodiment of the method according to the invention, the geometric variable can be a distance between two predetermined features of the image artifact or a distance between a predetermined feature and a line connecting two predetermined features of the image artifact. Features of the image artifact are determined, for example, by image intensities of the artifact in the image data. By using characteristic features of the artifact, a reproducible, quantitative determination of the geometric variable and the magnetic interference field are also enabled with various imaging attributes, for example various resolutions.

For example, the image artifact can exhibit predetermined features in the form of three areas with intensity increased in comparison to the surrounding pixels. A distance (a') between the edge of a first of the areas and the edge of a second of the areas or a distance (d) between the center of a first of the areas and a line that connects the centers of the two other areas can be determined as a geometric variable. The longer of the two distances is advantageously determined, so errors in the determination can be reduced. An identification of the image artifact or of the corresponding region in the image data can initially ensue to establish the areas. The features in this region can be identified, for example, by determining the pixels having an intensity above a predetermined threshold.

For example, the image artifact can be triangular or in the shape of an arrowhead. The three areas can be arranged at the vertices of an essentially isosceles triangle, and the distance between the edges of the areas at the base of the triangle or the distance of the points relative to the base of the triangle can be determined as a geometric variable. "Essentially" "isosceles" means that certain variations of the side lengths of the triangle can be present, for example a variation that advantageously amounts to less than 20%, advantageously less than 10% of the side length. The variations can be caused by distortions in the acquired magnetic resonance (MR) image data.

It is also possible for the image artifact to have at least two band-shaped features, and the distance (d) between the two band-shaped features is determined as a geometric variable. Particularly at a lower resolution, two of the aforementioned areas can merge into a band. For example, the image artifact can have two bands with high intensity and a band of lower intensity lying in-between them, and the distance between the centers of the bands of higher intensity can be determined as a geometric variable. The bands can have different lengths; in particular, they can even be so short as to be essentially circular.

According to one embodiment, the positions of the predetermined features of the artifact in the image data are determined automatically with an image processing unit. The automatic determination of the geometric variable can subsequently ensue with the image processing unit based on the automatically determined positions of the features. A fast quantification of the magnetic interference field is thus possible. Methods—for example the threshold method (thresholding) described in the preceding—can be used for the determination of the feature position.

It is likewise possible for the determination of the geometric variable of the image artifact to ensue automatically in a computerized processor (calculator) in response to a manual setting of markings at features of the image artifact in the image data. The determination of the geometric variable can ensue by determination of a distance between two of the manually set markings. The determination of the magnetic interference field in a fast and simple manner is therefore enabled without image processing of the acquired image data having to occur.

The interference object is advantageously a point-shaped or spherical interference point. For such interference points the present method enables a particularly precise quantification of the induced magnetic interference field.

The determination of the geometric variable can ensue in a coronal or sagittal slice image of the image data. Coronal and sagittal planes are referenced to the longitudinal direction of the magnetic resonance system with which the image data was acquired. Artifacts that are present in these slice images enable a particularly precise quantification of the magnetic interference field. It is possible for the determination of the geometric variable of the image artifact to ensue in a transverse slice image. A transverse slice image can image a slice that is perpendicular to the longitudinal direction.

The strength of the magnetic interference field can be determined from the fourth power of the geometric variable and the strength of the readout gradient (G) that was applied during the acquisition of the image data. In particular, the strength c of the magnetic interference field can be determined according to $c=f G I^4$, wherein G is the strength of the readout gradient, I is the geometric variable and f is a factor that has a value in a range between 0.01 and 0.07. The value can depend on the selected geometric variable. For example, if the variable I-a' is selected, the value can lie between 0.05 and 0.07, for example at I-0.061. If the variable I=d is selected, the value can lie between 0.01 and 0.02, for example at 0.0138.

In one embodiment the interference object is one or more magnetic tracer particles. For example, the tracer particles can be hollow spheres that contain a paramagnetic material. In particular the use of a superparamagnetic material (for example iron oxide in the form of nanoparticles) is advantageous.

The method can furthermore include the determination of a density of magnetic tracer particles in a region of the examination subject based on the specific strength of the magnetic interference field. It is thus enabled to quantify accumulations of tracer particles in the examination subject.

Furthermore, a correction of the image data can ensue based on the specific strength of the magnetic interference field. Adulterations of the image data that are caused by the image artifact can thereby be reduced or even corrected.

The strength of the magnetic interference field can be determined as being proportional to the product of the volume V of the interference point and the susceptibility jump $\Delta_\chi$ between interference point and surrounding material. Furthermore, a determination of a volume of the interference object can ensue based on the susceptibility difference and the determined strength of the magnetic interference field if the difference of the susceptibility of the interference object and the surrounding material exhibits a predetermined value (i.e. is known). For known volumes of the interference object, the magnetic susceptibility of the interference object or of the material that surrounds the interference object can be determined based on the volume and the determined strength of the magnetic interference field.

The method can furthermore include the implementation of the imaging magnetic resonance measurement to acquire the image data in order to provide said image data.

The aforementioned method steps all can be implemented automatically by a computer. A fast determination of the magnetic interference field is thus enabled without a user intervention being required.

According to a further aspect of the present invention, a magnetic resonance system is provided that is designed for the determination of the strength of a magnetic interference field that is caused in an imaging magnetic resonance measurement by an interference object that exhibits a magnetic susceptibility that differs from the magnetic susceptibility of the material surrounding said interference object. The magnetic resonance system has a data acquisition unit that is designed to implement a magnetic resonance imaging measurement (data acquisition pulse sequence) to acquire image data. Furthermore, it has a computer that is configured to: access image data acquired with the acquisition unit, which image data image an examination subject that contains the interference object, determine at least one geometric variable of an image artifact in the image data that was generated by the magnetic interference field, and determine the strength of the magnetic interference field caused by the interference object on the basis of the determined geometric variable.

Advantages similar to those cited for the method can be achieved with a magnetic resonance system of such a design. The magnetic resonance system can be designed to implement any or all of the embodiments of the method described above.

The invention also encompasses a non-transitory, computer-readable storage medium encoded with programming instructions that is loadable into a computerized processor supplied with magnetic resonance data acquired from an examination subject containing an interference object that has a magnetic susceptibility that differs from the magnetic susceptibility of material surrounding the interference object. The programming instructions cause the computer to implement the method described above, as well as any and all embodiments thereof.

BRIEF DESCRIPTION OF THE DRAWINGS

FIG. 2 shows an example the image of an image artifact in image data as well as geometric variables of the image artifact that can be used for the determination of the magnetic interference field according to an embodiment of the method according to the invention.

FIG. 3 shows a further, exemplary representation of an image artifact in image data.

FIG. 4 is a flow diagram of an embodiment of the method according to the invention.

DESCRIPTION OF THE PREFERRED EMBODIMENTS

Figure 1:
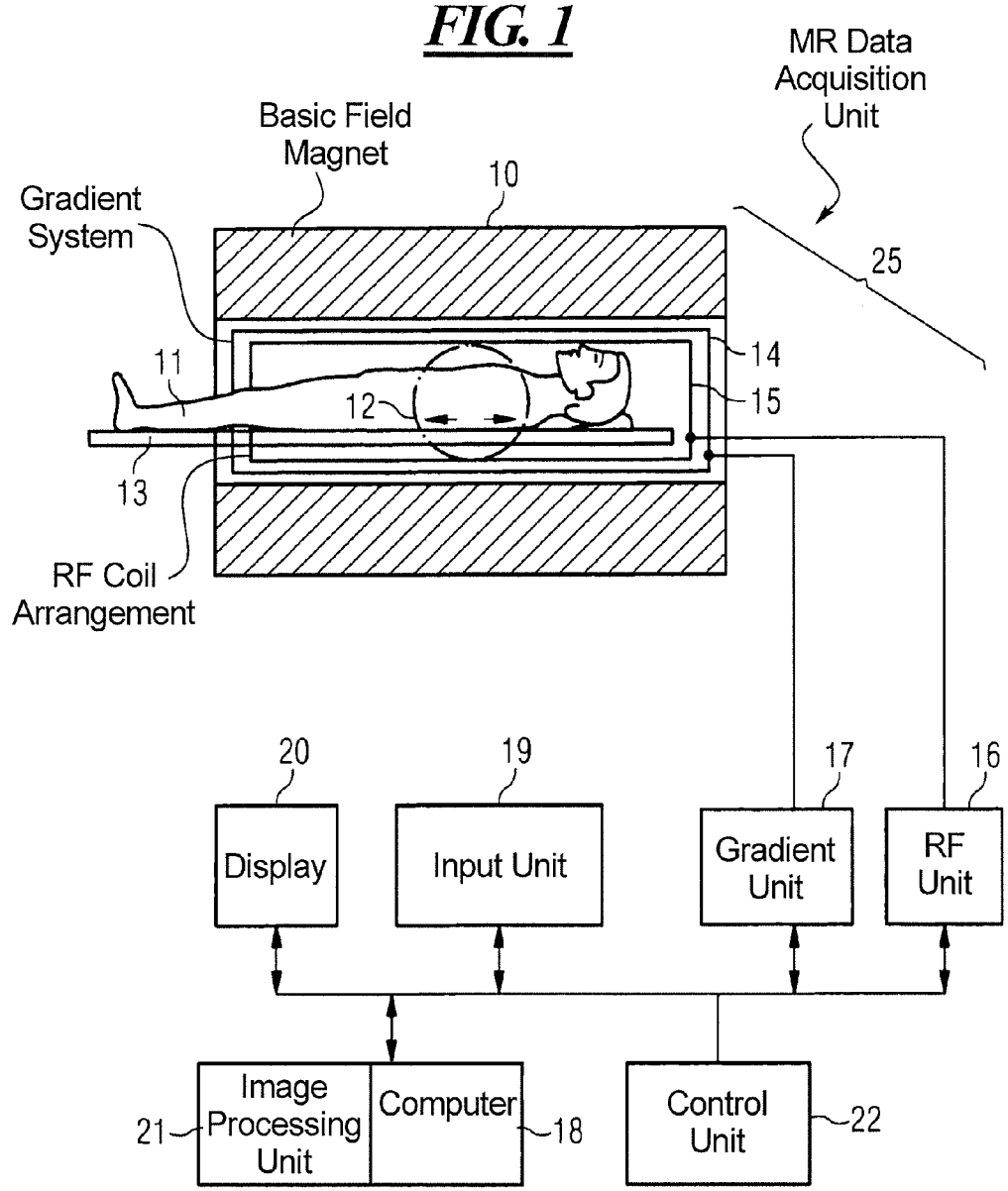
FIG. 1 is a schematic block diagram of an embodiment of the magnetic resonance system according to the invention.

FIG. 1 schematically shows a magnetic resonance system with which the magnetic interference field caused by an interference object in the body of the person to be examined 11 in an imaging magnetic resonance measurement can be determined in a simple manner. The MR system has a basic field magnet 10 to generate a basic magnetic field $B_0$ that aligns nuclear spins in an examination subject (here the person to be examined 11) who is moved on a bed 13 into the magnet, as is schematically illustrated by the arrows. The MR system furthermore has a gradient system 14 to generate magnetic field gradients that are used for read out and spatial coding of the MR signals. A radio-frequency coil arrangement 15 radiates a radio-frequency field into the examined person 11 in order to deflect the magnetization of the nuclear spins out of the steady state (equilibrium state) caused by the polarization resulting in the basic magnetic field. A gradient unit 17 is provided to control the magnetic field gradients and an RF unit 16 is provided to control the radiated RF pulses. Components serving in the acquisition of MR signals (for example the RF coil arrangement 15, the RF unit 16, the gradient system 14 and the gradient unit 17) can be summarized as an MR data acquisition unit 25. The control unit 22 centrally controls the magnetic resonance system, for example the implementation of a predetermined imaging MR sequence. A selection of the imaging sequence to be implemented can, for example, ensue with the input unit 19. Control information—for example imaging parameters—as well as reconstructed image data can be displayed on the display 20.

In an imaging magnetic resonance measurement, MR signals are acquired from the examination region 12 of the MR system (for example by means of the RF coil arrangement 15 or by means of local coils). This can ensue while a spatial coding gradient of strength G is applied with the gradient system 14 over the examination region 12. An optimally homogeneous basic magnetic field $B_0$ and an optimally homogeneous $B_1$ field (field strength of the radiated RF pulses) are required for an optimally distortion-free imaging. If magnetizable tracer particles are presented in the body of the person to be examined 11, the applied magnetic fields are disrupted. In particular, a magnetization of the interference objects in the form of the tracer particles occurs, wherein the magnetic field caused by the magnetization overlays the externally applied magnetic fields. This consequently leads to an inhomogeneity of the magnetic field at the positions at which the tracer particles are located, the strength of which inhomogeneity essentially depends on the susceptibility difference between the interference object and the material that surrounds the interference object (i.e. the tissue of the person to be examined 11). The disruption of the magnetic field leads to artifacts in the image data that are reconstructed from the acquired RF signals. Such image artifacts are illustrated as examples in FIGS. 2 and 3.

The present invention is based on the realization that the strength of the magnetic interference field that is caused by the interference objects can be concluded from the artifacts in the image data. In particular, a quantification of the interference field is enabled via determination of geometric variables, for example distances between features of the image artifact. A computer 18 is provided for this. The reconstruction of image data from acquired RF signals and an analysis of said image data ensues in computer 18. Coronal and/or sagittal slice images can be reconstructed and image artifacts are identified in these. The reconstruction of transverse slice images and the identification of image artifacts in these are likewise possible. The computer 18 includes an image processing unit 21 that determines features in the image data for an identified artifact. The computer 18 is furthermore designed in order to calculate a distance between the features determined for the artifact and to determine the strength of the magnetic interference field from this distance. The computer 18 can furthermore be designed in order to implement additional steps based on the determined strength of the magnetic interference field, for example: the determination of the concentration of tracer particles in the body of the person to be examined 11, the determination of material properties (in particular the susceptibility $\chi$) of the tracer particles or the surrounding tissue, and correction of the image data in order to calculate identified artifact from the image data. The specific strength of the magnetic interference field can also be provided for additional processing steps, for example for simulations or the like.

In another embodiment of the magnetic resonance system the identification of the image artifacts and a marking of features of the image artifacts ensue manually by a user by means of input unit 19. For example, the computer 18 is then designed to display a sagittal or coronal slice image to the user on display 20 after a reconstruction of the image data and implements an automatic calculation of the geometric variable of the image artifact in response to the marking of (for example) two features of an image artifact. Furthermore, the automatic calculation of the magnetic interference field and (as mentioned above) additional variables dependent on this can subsequently ensue in the computer 18.

Naturally, the magnetic resonance system can have additional components that are known in a conventional magnetic resonance system. The general mode of operation of an MR system is known to those skilled in the art, so that here a more detailed description of the general components is not necessary herein. It is likewise possible to combine the units shown in FIG. 1 into one unit. For example, the control unit 22 and the computer 18 can be combined into one unit.

The flow diagram of FIG. 4 illustrates a method according to one embodiment of the present invention, wherein the magnetic resonance system shown in FIG. 1 can be designed to implement this method. In a first Step 51, the acquisition of image data of a person to be examined ensues with the MR system, wherein the body of the person to be examined possesses tracer particles. However, the body of the person to be examined can also have other interference objects (for example dental implants, air bubbles or the like), wherein the magnetic interference fields caused by these additional interference objects can likewise be quantified with the method. Multiple tracer particles can, for example, collect into point-shaped interference sources. Depending on the application, the tracer particles are different but generally exhibit a different magnetic susceptibility than that of the tissue of the person to be examined. In particular, tracer particles can be used that possess paramagnetic or superparamagnetic material. In particular iron oxide (also in the form of nanoparticles, for example) are thereby considered as a material for the tracer particles. One application of the method is the quantification of the accumulation of such marked tracer particles in the form of hollow spheres. These hollow spheres can internally contain insulin-producing islet cells and thus serve for the treatment of the person to be examined. The precise knowledge of the accumulation of these particles in the body of the person to be examined is of decisive importance. A quantification of these accumulations can be achieved with the present method.

The provision of the acquired image data to image processing ensues in Step 52. The image data can be additionally processed directly in the magnetic resonance system with which they were acquired, or they can be provided by means of a data medium or a network connection to another computer for the additional processing. In Step 53 the identification of an image artifact in the image data that was caused by one or more tracer particles ensues in the image processing. For example, the shape of the image artifact or intensity values of the pixels of the image artifact can be used to recognize such an image artifact in the image data. Multiple methods for the recognition of a pattern in image data are known to the man skilled in the art, and these can be used at this point in order to detect image artifacts in the image data. Image artifacts caused by an interference object are illustrated in FIGS. 2 and 3.

The image artifact shown in FIG. 2 is triangular or shaped like an arrowhead and respectively possesses, at the corners of the triangle, an area in which the intensity of the corresponding pixels is increased. The areas form an essentially isosceles triangle with the area 31 at the tip of the triangle and the areas 32 and 33 at the vertices of the base of the triangle. The image data 30 shown in FIG. 3 possess a lower resolution than the image data 30 of FIG. 2, such that the image artifact is band-shaped. The areas 32 and 33 at the light bands 41 with increased image intensity are merged. The light band 43 corresponds to the area 31, wherein a dark band 42 with lower image intensity lies between the bands 41 and 43.

It should be clear that, depending on the form of the interference point and depending on the strength of the magnetic interference field generated by the interference point, other image artifacts than those shown can also be acquired. The artifacts shown here were caused by spherical interference points, wherein an interference point comprises (for example) a single or multiple tracer particle(s). In slice images that are different than the shown coronal or sagittal slice images, the image artifacts can have different shapes. For example, in a transverse slice image a side view of the shown image artifacts is imaged so that the image artifact from FIG. 2 is imaged as two overlapping points of increased image intensity. The length 36 (distance d) can then be determined as a geometric variable, for example.

The strength of the magnetic interference field is now determined from the identified image artifacts. For this at least two features of the image artifact are automatically localized or manually marked in Step 54. A manual marking can ensue by means of the input unit, wherein the image processing unit then provides a measurement tool (for example) and automatically determines the distance of the manually placed markings. However, the localization of the features advantageously ensues automatically, for example by means of a segmentation algorithm that identifies and locates the regions of increased intensity of the image artifact (the areas 31-33 in FIG. 2 or the bands 41 and 43 in FIG. 3), i.e. determines their position. Based on the features of the image artifact, a geometric variable of the image artifact is determined in Step 505. For example, the geometric variable a' is marked with the reference character 35 and the geometric variable d is marked with the reference character 36 in FIG. 2. The variable 35 is the distance a' between the edge of the areas 32 and 33. This edge of the areas can in particular be determined with the assistance of the line 37 that extends in the longitudinal direction (i.e. $\Delta z=0$) and that contacts both the edge of the area 31 and that of the area 32. For example, the line can be placed so that the image intensities at the edge of the respective areas 31 and 32 correspond at the contact points with the line. The edge of the area 33 can be determined similarly, and thus the distance a'. If the variable a' cannot be determined—for example due to a low resolution as shown in FIG. 3—the distance d between the center of the area 31 and the connection line between the centers of the areas 32 and 33 can also be determined as a geometric variable. The centers of the areas thus span an essentially equilateral triangle, wherein the height of the triangle corresponds to the distance d labeled with reference character 36.

The longer (and therefore less error-prone) distance is advantageously measured. If the distance a' is not recognizable due to small dipole strengths or low resolution, the distance d is measured. Simulations of the image artifacts could thereby establish an approximately constant ratio of approximately 1.45 between the lengths d and a'. Both lengths or distances can consequently be used to determine the magnetic interference field.

The distance d (reference character 46) and the interval of the centers of the bands 41 and 43 are determined in the image data with reduced resolution from FIG. 3. For example, a line of maximum intensity parallel to the longitudinal direction or, respectively, expansion direction of the band is determined for each band, and the interval of the two lines is determined as distance d. The distance a' can be concluded via the aforementioned ratio.

After the determination of the geometric variable, in particular the distance a' or d, the calculation of the strength of the magnetic interference field that was caused by the one or multiple tracer particle(s) in the acquisition of the image data ensues in a next Step 56 (referring again to FIG. 4). The magnetic field (i.e. the magnetic flux density B) caused by a point-shaped or, respectively, spherical interference point can be calculated according to the dipole formula $$B_{z,inh} = c \cdot \frac{x^2 + y^2 - 2 \cdot z^2}{(x^2 + y^2 + z^2)^{5/2}} \tag{1}$$

wherein x, y and z designate the spatial coordinates of a Cartesian coordinate system in which the interference point is located at the origin. $B_{z,inh}$ is the z-component of the magnetic flux density B that is relevant to the imaging, wherein the prefactor c indicates the strength of the dipole field. The strength of the dipole field (i.e. of the magnetic interference field) is determined by $$c = \frac{B_0 \Delta \chi V}{4\pi}, \tag{2}$$

wherein $B_0$ designates the basic magnetic field, $\Delta_\chi$ designates the susceptibility jump between interference object and surrounding material, and V designates the volume of the interference object. This dipole field is caused by the magnetization of the interference object that is induced by the basic magnetic field $B_0$ (and possibly by applied magnetic field gradients and the B1 field). In the imaging measurement, the magnetic interference field in the form of the induced dipole field overlaps the applied basic magnetic field and the applied gradient fields with which the spatial coding is achieved. This can lead to a significant inhomogeneity of the basic magnetic field (in particular in proximity to the interference object) that is responsible for the observed image artifacts.

In the present embodiment of the invention, the geometric variable determined from the image artifact is now used to calculate the strength c of the dipole field. With use of the distance a', the strength c is calculated according to the analytically derived formula as $$c = \frac{3^{5/2}}{2^8} Ga'^4 \approx 0.061 Ga'^4, \tag{3}$$

with the prefactor f=0.061.

G thereby designates the strength of the readout gradient that was applied during the acquisition of the corresponding image data. The connection between the geometric variable of the artifact and the strength of the magnetic interference field thus enables the calculation of the latter. It is likewise conceivable to use different geometric variables than the distances a' and d of the artifact to calculate the dipole field strength c. If the distance d is us used for calculation in the aforementioned formula instead of the distance a', a different prefactor results due to the cited ratio of the two distances, such that $c \approx 0.0138 \, Gd^4$. The prefactor f can thus vary depending on the selection of the geometric variable.

The calculation of the strength c is subsequently explained in an example with reference to FIG. 3. The distance 46 between the two features 41 and 43 of the shown artifact is determined from the MR image data 40 as d=3.4 mm. The strength of the readout gradient can be calculated according to $$G_{Read} = \frac{B \cdot WN}{\gamma \cdot FOV} \qquad (4)$$

wherein BW designates the bandwidth of the readout gradient (Hz), N designates the matrix size in the readout direction, γ designates the gyromagnetic ratio (MHz/T) and FOV designates the field of view (mm). In the example, the strength of the readout gradient was G=1.60 mT/m. According to the aforementioned relationship, the strength of the dipole field can now be determined:

$c = 0.061 \cdot 1.6 \, mT/m \cdot a'^4 = 0.061 \cdot 1.6 \, mT/m \cdot (3.4 \, mm/1.45)^4 = 2.95 \cdot 10^{-6} \, Tmm^4$.

Additional method steps can now follow on the basis of the determined strength of the magnetic interference field.

For example, in Step 57 the determination of the concentration of the tracer particles ensues on the basis of the calculated strength of the magnetic interference field. The strength of the interference field is normally proportional to the number of tracer particles that the interference object comprises. A quantification of the interference can thus be achieved. Since the basic magnetic field strength $B_0$ is normally known, according to Equation (2) a value for the factor $\Delta_X \cdot V$ can furthermore be obtained from which additional conclusions about the interference object can be drawn. In the aforementioned example, the image data 40 were acquired with a field strength of B0=1.5 T. The factor $\Delta_X \cdot V$ can therefore be calculated as $\Delta_X \cdot V = c \cdot 4\pi/B_0 = 2.47 \cdot 10^{-5} \, mm^4$ For example, in Step 58 a determination of the susceptibility jump ΔX between tracer particles and surrounding material can now ensue with knowledge of the factor. Given knowledge of the susceptibility of the surrounding material or, respectively, tissue, the susceptibility of the interference point can thus be determined, or conversely given a known susceptibility of the interference point (i.e. of the tracer particle) the susceptibility of the surrounding material can be calculated. Furthermore, given knowledge of the susceptibility jump $\Delta_X$ the calculation of the volume of the interference point is possible. The calculated volume thereby normally corresponds to the volume of the tracer material (iron oxide, for example) shrunken into the solid sphere.

Moreover, given knowledge of the magnetic interference field the correction of the image artifact in the image data can ensue (Step 59). In particular, a precise imaging of the tissue surrounding the interference point can therefore be achieved. This is in particular of interest for interference points in the form of air inclusions or implants that significantly impair the imaging in surrounding regions given conventional methods.

In summary, a quantification of interference points in imaging magnetic resonance measurements is enabled with the present invention, which quantification can be implemented in a simple and efficient manner. In particular, the determination of the magnetic interference field requires no additional acquisition coils and the like. Many conclusions can be drawn from the determined strength of the magnetic interference field, not only with regard to the interference point itself but also with regard to surrounding material. One application example that profits from the advantages of the invention is the quantification of accumulations of tracer particles in the body of a person to be examined.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to determine a strength of a magnetic interference field caused by an interference object located in a magnetic resonance data acquisition unit, comprising the steps of:

providing magnetic resonance image data to a processor, said magnetic resonance image data comprising image data acquired from a measurement volume, in which an interference object is located, of a magnetic resonance data acquisition unit, using a readout gradient generated with a gradient field strength in said magnetic resonance data acquisition unit, said interference object causing a magnetic interference field, and having a magnetic susceptibility that differs from a magnetic susceptibility of material surrounding the interference object;

from said processor, making said image data available in a form allowing determination of at least one geometric variable of an image artifact in said image data caused by said magnetic interference field;

from said image data in said form, determining said at least one geometric variable; and in a computerized computation unit, automatically determining the strength of the interference field caused by the interference object, as a product of the fourth exponential power of the determined geometric variable of the image artifact, and said gradient field strength.

2. A method as claimed in claim 1 comprising determining said at least one geometric variable as a distance selected from the group consisting of a distance between two predetermined features of said image artifact, and a distance between a predetermined feature of the image artifact and a line connecting two other predetermined features of the image artifact.

3. A method as claimed in claim 1 wherein said image data is comprised of pixels, and wherein said image artifact comprises predetermined features respectively formed by three areas of pixels having an intensity that is higher than an intensity of surrounding pixels, and comprising determining said geometric variable as a distance selected from the group consisting of a distance between an edge of a first of said three areas and an edge of a second of said three areas, and a distance between a center of a first of said three areas and a line connecting respective centers of a second and a third of said three areas.

4. A method as claimed in claim 3 wherein said three areas are respectively located at vertices of an isosceles triangle, and comprising determining said distance as a distance selected from the group consisting of a distance between edges at the base of the isosceles triangle, and a distance between points relative to the base of the isosceles triangle.

5. A method as claimed in claim 1 wherein said image artifact comprises at least two band-shaped features, and comprising determining said geometric variable as a distance between said two band-shaped features.

6. A method as claimed in claim 1 comprising supplying said image data in said form to a computerized image processing unit, and automatically determining said at least one geometric variable by processing of said image data in said form in said computerized image processing unit.

7. A method as claimed in claim 1 comprising making said image data available in said form by reconstructing an image from said image data and displaying said image at a display, and determining said geometric variable by manually marking features of said image artifact in the image at said display, and determining a distance between the manually marked features at said display.

8. A method as claimed in claim 1 wherein said interference object has a configuration selected from the group consisting of a point-shaped configuration and a spherical point configuration.

9. A method as claimed in claim 1 comprising determining said geometric variable in a plane selected from the group consisting of a coronal plane, a sagittal plane and a transverse plane in said image data.

10. A method as claimed in claim 1 comprising determining the strength of the magnetic interference field c according to:

$$c = f\,G\,I^4$$

where G is said gradient field strength, I is said geometric variable, and f is a factor having a value in a range between 0.01 and 0.7.

11. A method as claimed in claim 1 wherein said interference object comprises at least one magnetic tracer particle.

12. A method as claimed in claim 11 wherein said at least one tracer particle is a hollow sphere containing paramagnetic material.

13. A method as claimed in claim 11 comprising determining a density of said at least one magnetic tracer particle in a region of an examination subject, from whom the image data were acquired, based on said strength of said magnetic interference field.

14. A method as claimed in claim 1 comprising correcting said image data based on said strength of said magnetic interference field.

15. A method as claimed in claim 1 wherein said difference between said magnetic susceptibility of said interference object and the susceptibility of said surrounding material exhibits a predetermined value, and comprising determining a volume of the interference object based on said predetermined value of said difference and said strength of said magnetic interference field.

16. A method as claimed in claim 1 wherein said interference object comprises a predetermined volume, and comprising determining the magnetic susceptibility of at least one of said interference object and said surrounding material based on said predetermined volume and said strength of said magnetic interference field.

17. A method as claimed in claim 1 comprising acquiring said image data from an examination subject in said measurement volume of said data acquisition unit.

18. A magnetic resonance system to determine a strength of a magnetic interference field caused by an interference object, comprising:
a magnetic resonance data acquisition unit having a measurement volume in which an examination subject is located and in which an interference object is located, said interference object causing an interference field having a strength, said interference object having a magnetic susceptibility that differs from a magnetic susceptibility of material surrounding the interference object;
a control unit that operates said data acquisition unit to acquire magnetic resonance image data from the measurement volume, using a readout gradient generated with a gradient field strength in said magnetic resonance data acquisition unit;
a processor configured to make said image data available in a form allowing manual or automatic determination of at least one geometric variable of an image artifact in said image data caused by said magnetic interference field;
from said image data in said form, determining said at least one geometric variable; and
a computerized computation unit configured to automatically determine the strength of the interference field caused by the interference object, as a product of the fourth exponential power of the determined geometric variable of the image artifact, and said gradient field strength.

19. A non-transitory, computer-readable medium encoded with programming instructions, said medium being loaded into a computerized control and processing system of a magnetic resonance apparatus comprising a magnetic resonance data acquisition unit, and said programming instructions causing said computerized control and processing system to:
receive magnetic resonance image data acquired from a measurement volume in said data acquisition unit, in which an interference object is located, using a readout gradient generated with a gradient field strength in said magnetic resonance data acquisition unit, said interference object causing a magnetic interference field, and having a magnetic susceptibility that differs from a magnetic susceptibility of material surrounding the interference object;
make said image data available in a form allowing determination of at least one geometric variable of an image artifact in said image data caused by said magnetic interference field;
from said image data in said form, determine said at least one geometric variable; and
determine the strength of the interference field caused by the interference object, as a product of the fourth exponential power of the determined geometric variable of the image artifact, and said gradient field strength.

* * * * *